US 6,662,966 B2

(12) United States Patent
Desai et al.

(10) Patent No.: US 6,662,966 B2
(45) Date of Patent: Dec. 16, 2003

(54) SURFACE MOUNT MANUFACTURING STORAGE SYSTEM

(75) Inventors: Bhavesh J. Desai, Fremont, CA (US); Derrick Gerrard D'Andrade, Ontario (CA); Roberto L. Arrieta, Hayward, CA (US)

(73) Assignee: SMTC Corporation, Ontario (CA)

( * ) Notice: Subject to any disclaimer, the term of this patent is extended or adjusted under 35 U.S.C. 154(b) by 155 days.

(21) Appl. No.: 09/893,840

(22) Filed: Jun. 28, 2001

(65) Prior Publication Data

US 2003/0000959 A1 Jan. 2, 2003

(51) Int. Cl.$^7$ ............................................. B65G 59/00
(52) U.S. Cl. ............................................. 221/1; 29/740
(58) Field of Search ........................... 221/1, 7, 13, 92, 221/131, 123, 174, 289; 29/739, 740, 829, 830; 414/267

(56) References Cited

U.S. PATENT DOCUMENTS

| | | | |
|---|---|---|---|
| 4,621,406 A | * 11/1986 | Fujiwara et al. | 29/564.2 |
| 5,208,969 A | 5/1993 | Hidese | 29/740 |
| 5,283,943 A | 2/1994 | Aguayo et al. | 29/701 |
| 5,319,846 A | 6/1994 | Takahashi et al. | 29/740 |
| 5,329,692 A | 7/1994 | Kashiwagi | 29/740 |
| 5,400,497 A | 3/1995 | Watanabe et al. | 29/705 |
| 5,456,001 A | 10/1995 | Mori et al. | 29/739 |
| 5,515,600 A | 5/1996 | Iwasaki et al. | 29/740 |
| 5,553,376 A | 9/1996 | Solanki et al. | 29/833 |
| 5,713,125 A | 2/1998 | Watanabe et al. | 29/833 |
| 5,740,604 A | 4/1998 | Kitamura et al. | 29/832 |
| 5,796,616 A | 8/1998 | Hamuro et al. | 364/468.28 |
| 5,822,210 A | * 10/1998 | Kobayashi et al. | 700/121 |
| 5,878,484 A | * 3/1999 | Araya et al. | 29/740 |
| 5,933,942 A | 8/1999 | Kitamura et al. | 29/740 |
| 5,979,045 A | 11/1999 | Nishimori et al. | 29/832 |
| 6,027,019 A | 2/2000 | Kou | 235/375 |
| 6,079,096 A | 6/2000 | Hata et al. | 29/740 |

FOREIGN PATENT DOCUMENTS

GB     2 317 496 A     3/1998

OTHER PUBLICATIONS

International Search Report for PCT/US 02/17792, Sep. 17, 2002.
Rua R, "An Overview of Surface Mount Placement Systems," Electronic Packaging & Production, vol. 32, (1992) Aug., Suppl., Newton, Mass., US.

* cited by examiner

*Primary Examiner*—Kenneth W. Noland
(74) *Attorney, Agent, or Firm*—Marshall, Gerstein & Borun LLP

(57) ABSTRACT

The storage system includes a storage platform cantilevered above a surface mount placement machine. The storage platform is attached to a vertical support member positioned adjacent to the surface mount placement machine. A storage tray is located on the storage platform and extends above the surface mount placement machine.

23 Claims, 6 Drawing Sheets

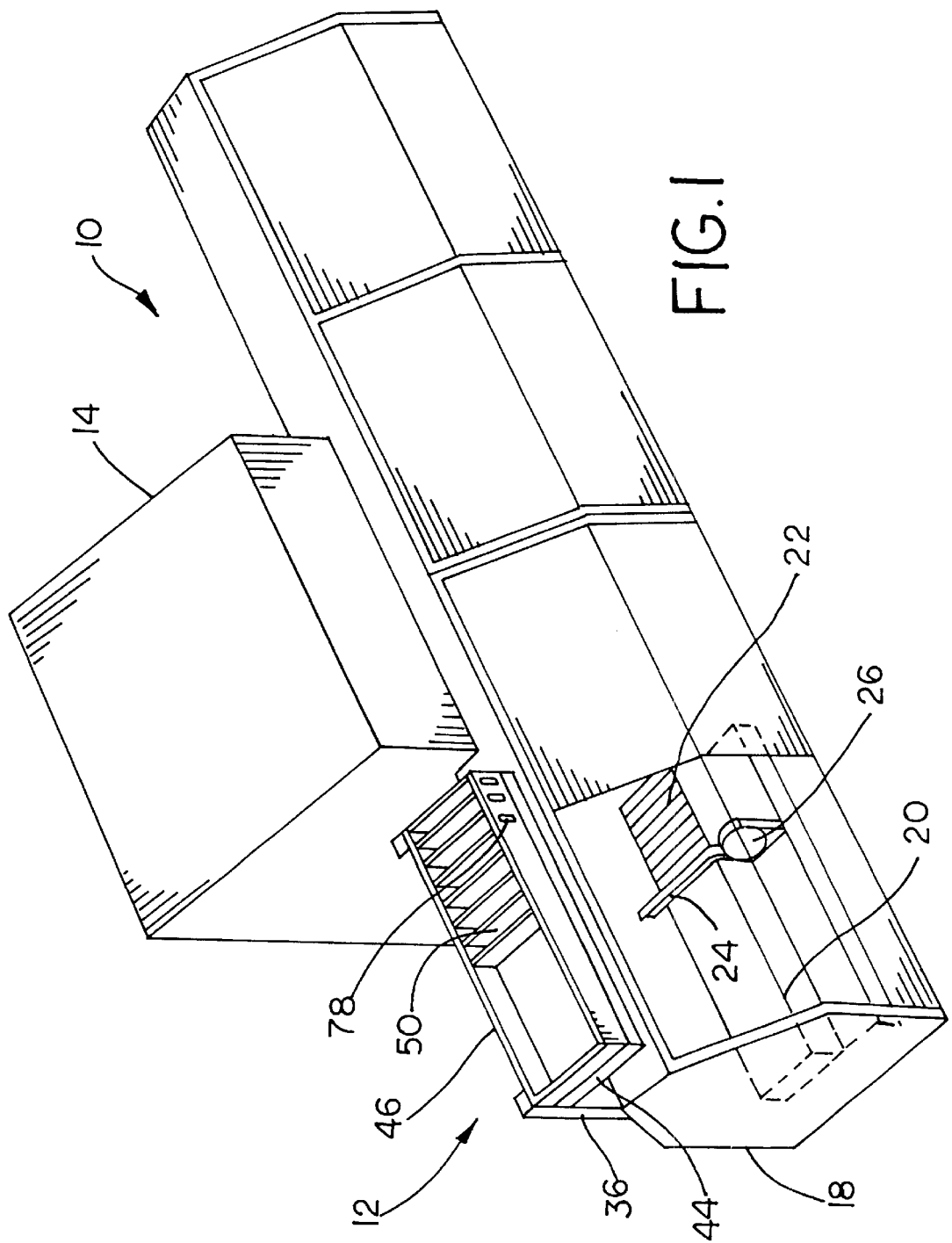

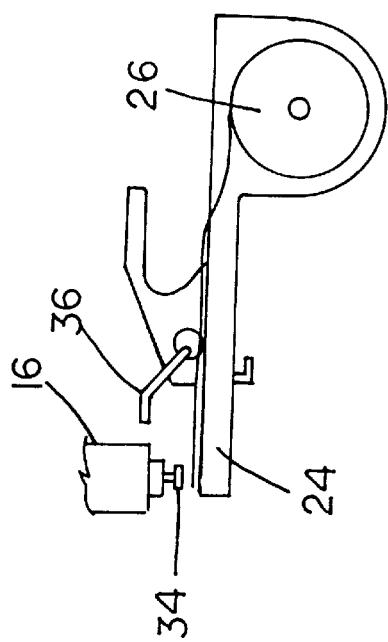
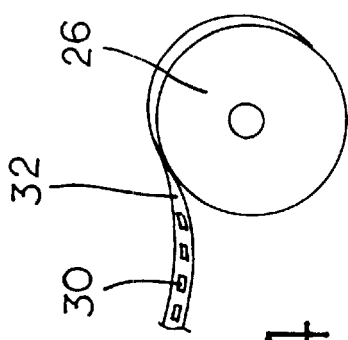
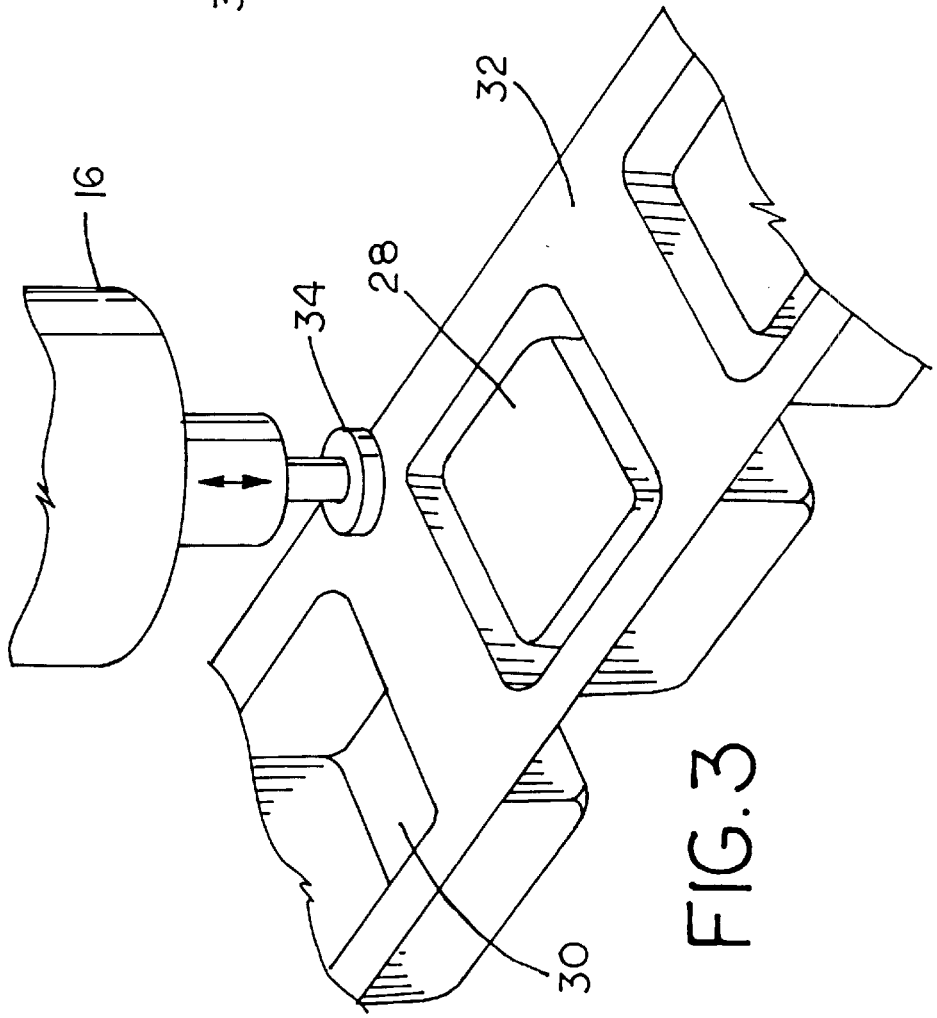

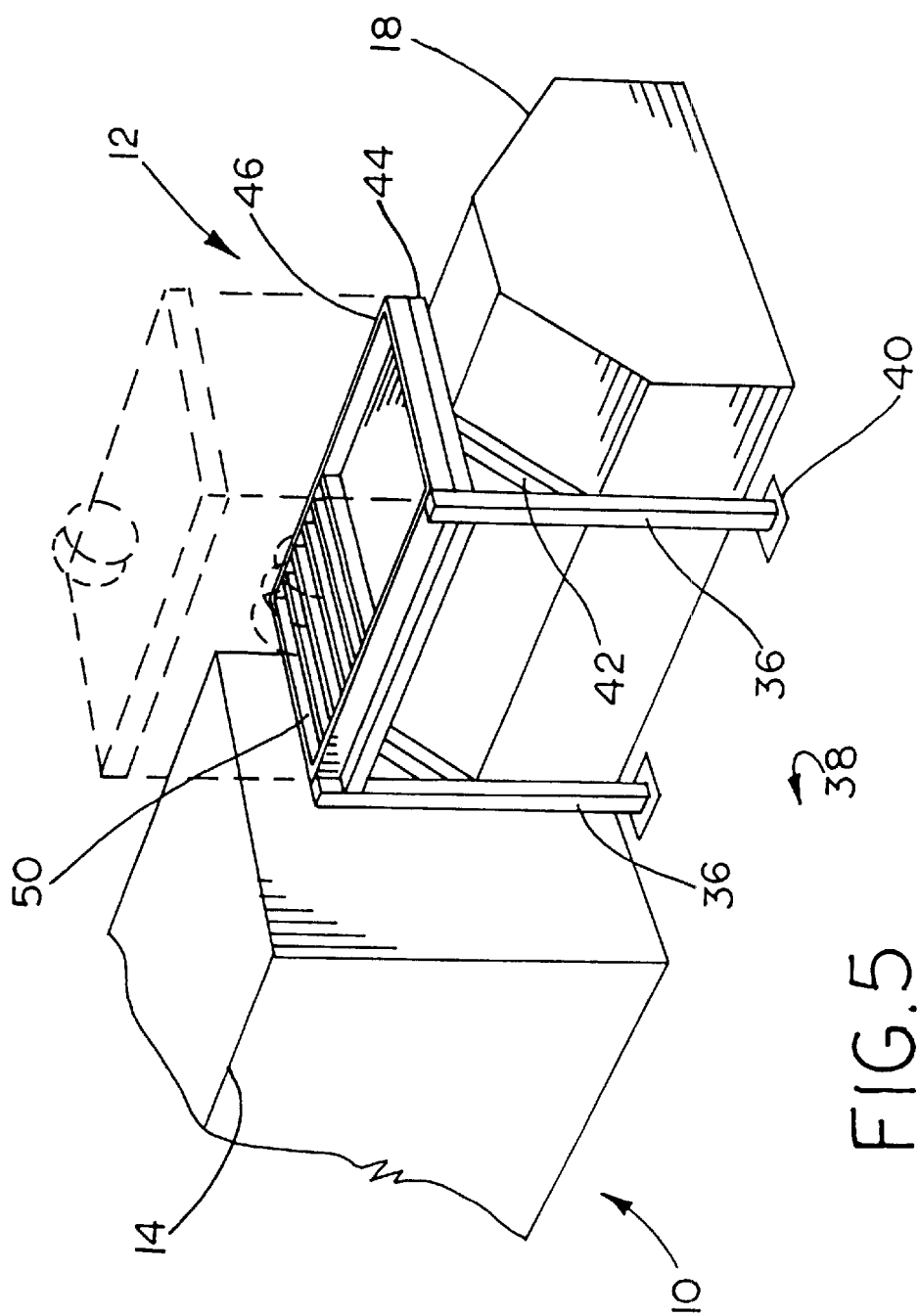

SURFACE MOUNT MANUFACTURING STORAGE SYSTEM

FIELD OF THE INVENTION

The invention relates generally to storage systems and, more specifically to storage systems used in surface mount manufacturing environments to increase floor space utilization.

BACKGROUND

Surface mount placement machines are well known in the art and are generally classified as either a gantry or turret style machine based on the design of the pick and place system. Gantry systems are generally constructed with a robot head mounted to one of two independent axes, the axes linearly translate to allow the head to pick up and place an individual surface mount component on a printed circuit board. Typically gantry style machines are used in low volume manufacturing applications to place odd shape or delicate surface mount components, examples of such components are ball grid arrays (BGAs) or fine-pitch quad flat packs (QFPs).

A turret style machine, often referred to as a chipshooter, is designed to place simple surface mount components on a printed circuit board in high volume manufacturing applications. Chipshooters are highly automated and are intended to operate with a minimum of operator intervention. Ideally, operator intervention is required only to insure that the chipshooter is supplied with raw materials, such as unfinished printed circuit boards and component reels loaded with individual surface mount devices like small outline integrated circuits (SOIC), resistors, capacitors, etc. To insure continuous operation of the chipshooters and to minimize production losses related to machine downtime, it is essential that raw materials be readily available. As a result, raw materials are generally stored as near to the chipshooters as possible.

A number of storage systems are presently utilized with chipshooters, each with varying degrees of success. For example, one known storage system uses a reinforced rectangular plastic bin constructed of a rigid plastic material. These bins are designed to interlock when vertically stacked and are sealable to protect their contents from moisture and other contaminants. The interior of these bins are featureless to maximize the quantity of surface mount component reels that can be stored within the bins. Normally, individual storage bins are preconfigured offline and loaded with the component reels and other raw materials necessary to manufacture a particular production lot, the configured storage bins are then transported to the appropriate production line prior to a product changeover. During the product changeover, the component reels are mounted on feeder cartridges, and the feeder cartridges, in turn, are installed in the proper position on a feeder bank associated with either the chipshooter or the gantry style machine. Excess bins containing spare component reels are stacked and are stored in accessible locations near the production line, an example of a typical location is the floor space in or around the aisle surrounding the chipshooter. When the surface mount placement machine uses all of the individual components on a component reel, the component reel can be replenished from a nearby bin in an attempt to minimize the equipment downtime.

Storage systems such as this have a number of flaws. For example, a single fully loaded bin is extremely heavy and is difficult for many operators to organize and transport. Moreover, a large amount of floor space is needed to store and organize spare and empty bins, floor space that could otherwise be converted into productive manufacturing space. Finally, the high initial and incremental costs associated with purchasing, replacing and maintaining enough bins to supply an entire manufacturing facility makes this system undesirable for many manufacturing applications.

To address these problems, some manufacturing facilities have begun to use a storage system modeled on portable industrial shelving to store and transport component reels. Industrial shelving storage systems are essentially wire storage racks mounted on rollers allowing them to be moved quickly and easily. Like the above described bins, this industrial shelving storage system can be preconfigured and loaded at an offline location and then positioned at a desired location near the production lines when needed. Using this storage system, a single individual can easily move all of the components needed to configure and supply an entire production line. By comparison to the multiple bin storage system described above, the industrial shelving storage system provides an efficient and cost-effective method of transporting and supplying raw materials to a production line. However, this system still requires a great deal of floor space to maneuver the racks into position around the production line and to store the racks when they are not in use.

SUMMARY OF THE DISCLOSURE

A storage system is disclosed that better utilizes manufacturing storage space than some known storage systems, to enable a person to store and organize the large number of, for example, surface mount component reels, needed to supply a surface mount placement machine, such as a chipshooter or gantry style machine. This system enables a user to preconfigure storage trays in an offline location and then rapidly exchange them during a product changeover to reduce the total machine downtime.

One embodiment of a storage system includes a storage platform located directly above the feeder carriage of a surface mount placement machine. By positioning the storage platform directly above the surface mount placement machine the contents of the storage platform are directly accessible to an operator standing near the machine, either manually or using a mechanical lift modified to support the contents of the storage platform. The storage platform is attached to a vertical support member which is fixedly attached to, for example, the floor and is disposed adjacent to the feeder carriage, so that the storage platform is disposed within the footprint of the surface mount placement machine. The storage platform is adapted to accept a storage tray designed to allow component reels to be stored above the feeder carriage. Individual surface mount components reels are organized within the storage tray in the same sequence in which they will be utilized by the surface mount placement machine, the replacement component reels are readily accessible and well-organized, as a result component reel replacement times may be reduced. In an alternate embodiment, the storage platform is slightly inclined relative to a feeder bank disposed within the feeder carriage to allow automatic presentation of component reels when the storage tray is disposed upon the storage platform. In yet another embodiment, the storage tray is removably disposed relative to the storage platform allowing for rapid exchange of storage trays.

BRIEF DESCRIPTION OF THE DRAWINGS

FIG. 1 is a perspective view of a storage system installed with respect to a surface mount placement machine;

FIG. 2 is a component supply feeder and component reel disposed adjacent to a vacuum nozzle of a surface mount placement machine;

FIG. 3 is a enlarged view of a vacuum nozzle in the process of picking up an individual surface mount device from a component reel;

FIG. 4 is a side view of a typical surface mount component reel;

FIG. 5 is a perspective view of another embodiment of a storage system illustrating the removability of a storage tray;

DETAILED DESCRIPTION

Figure 6:
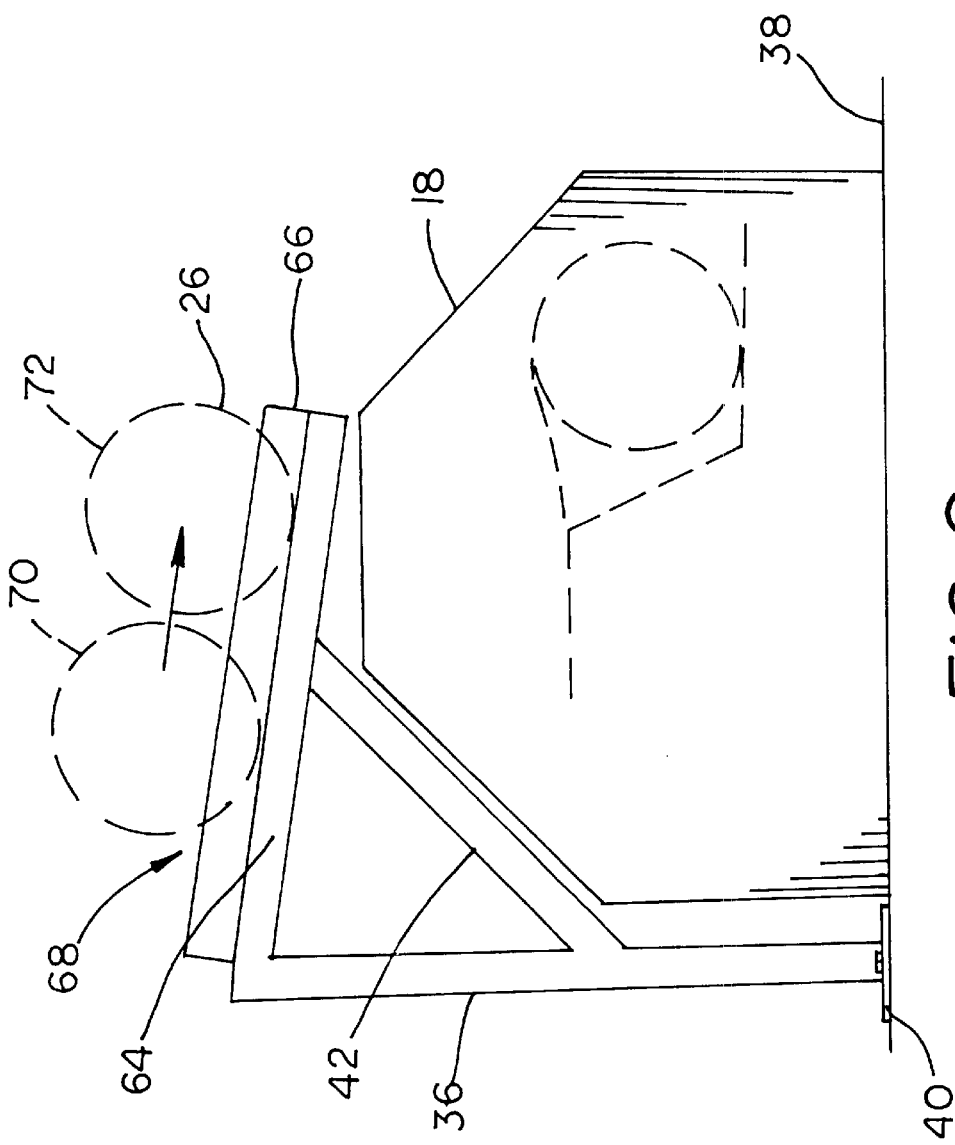
FIG. 6 is a side view of another embodiment of a storage system.

FIG. 1 illustrates a chipshooter 10 and a storage system 12 disposed adjacent to the chipshooter 10. As illustrated in FIG. 1, the chipshooter 10 is generally constructed with a tall, square main machine base 14 containing a turret (not shown) with a plurality of vacuum heads 16, illustrated in detail in FIGS. 2 and 3, attached to its circumference. The main machine base 14 is, in turn, attached to a low, rectangular housing called a feeder carriage 18, at the midpoint thereof. A feeder base 20 includes numerous positions 22 on which to mount a component feeder cartridge 24 and is capable of translating laterally via a servo motor positioning system. FIG. 2 illustrates a single component feeder cartridge 24 loaded with a component reel 26 containing, as best illustrated in FIGS. 3 and 4, individual surface mount devices 28 supported in pockets 30 formed into a thin strip of paper or embossed plastic tape 32.

In operation the feeder base 20 illustrated in FIG. 1 translates laterally to position a component feeder cartridge 24 and associated component reel 26 assembly beneath the vacuum head 16, illustrated in FIGS. 2 and 3. The vacuum head 16 then translates vertically, relative to the feeder base 20, and a vacuum nozzle 34 extracts a single surface mount device 28 from the tape pocket 30 in the component reel 26. Simultaneously, a feed mechanism, not shown, engages a feed lever 36 mechanism of the feeder cartridge 24 to index the component reel 26 forward to expose the next surface mount device 28 for pickup. Upon completion of these operations, the vacuum head 16 is transferred to the next station around the circumference of the turret, and the pickup sequence is repeated. Eventually the first component is transferred to the front of the turret and is suspended above the unfinished printed circuit board. At this point, the vacuum head 16 again shifts vertically, relative to the feeder base 20 and to the printed circuit board, and the vacuum pressure is disengaged as the surface mount device 28 comes into contact with the top surface of the printed circuit board. This placement sequence is repeated until the unfinished printed circuit board is populated with the preprogrammed number and type of surface mount devices 28.

Referring again to FIG. 1, the storage system 12 is intended to take advantage of the unutilized space above the feeder carriage 18 to provide storage for surface mount device component reels 26 that are used to supply the feeder cartridges 24 secured on the feeder base 20. The unutilized space exploited by the storage system 12 is created in part by the differences in heights and shapes between the main machine base 14 and the feeder carriage 18. As illustrated in FIGS. 5 and 6, the storage system 12 includes a vertical support structure 36 which is securely attached to the floor 38 via a number of attachment members 40 and is positioned adjacent to the feeder carriage 18. If desired, it is possible to adapt the attachment members 40 to be received within a cavity, not shown, prepared in the floor 38. The vertical support structure 36 may be reinforced by a plurality of brace members 42 if so desired. A number of structural members forming a shelf 44 that may be cantilevered over the top of the feeder carriage 18 are attached to the top of the vertical support structure 36. In the embodiment of FIG. 5, the shelf 44 and vertical support structure 36 are designed to support a storage tray 46 within the footprint defined by the floorspace occupied by the main machine base 14 and the feeder carriage 18 of the chipshooter 10. The storage tray 46 may be configured with a plurality of storage slots 50 that support and organize component reels 26 (see FIG. 4).

Thus, the storage system 12 has the shelf 44 cantilevered over the feeder carriage 18 wherein the shelf 44 is supported by a plurality of vertical support structures 36 and may be reinforced by a plurality of brace members 42. In this embodiment, the storage tray 46, having a plurality of storage slots 50, is removably disposed relative to the shelf 44 to allow for quick removal and replacement of the storage tray 46 during a production changeover. A commercially available lift, not shown, can be used to extract the entire storage tray 46 and replace it with a preconfigured storage tray 46 that corresponds to the feeder cartridge setup on the feeder base 18 for the new production run. This ability to preconfigure storage trays 46 offline minimizes the time needed for a production changeover and increases the speed at which the chipshooter 10 can be returned to continuous production.

In the embodiment illustrated in FIG. 6, the vertical support structure 36 supports an inclined shelf 64 which, in turn, supports an elongated storage tray 66. The elongated storage tray 66 contains a plurality of elongated storage slots 68, each of which is capable of accepting multiple component reels 26. The storage system 12 of FIG. 6 uses gravity feed for automatically presenting replacement component reels to the operator. The gravity feed operates by storing multiple component reels 26 in each elongated storage slot 68, and when a component reel 26 is removed from the presentation position 72, a replacement reel in the storage position 70 automatically translates down the inclined slope of the elongated storage tray 66, to the presentation position 72.

Figure 7:
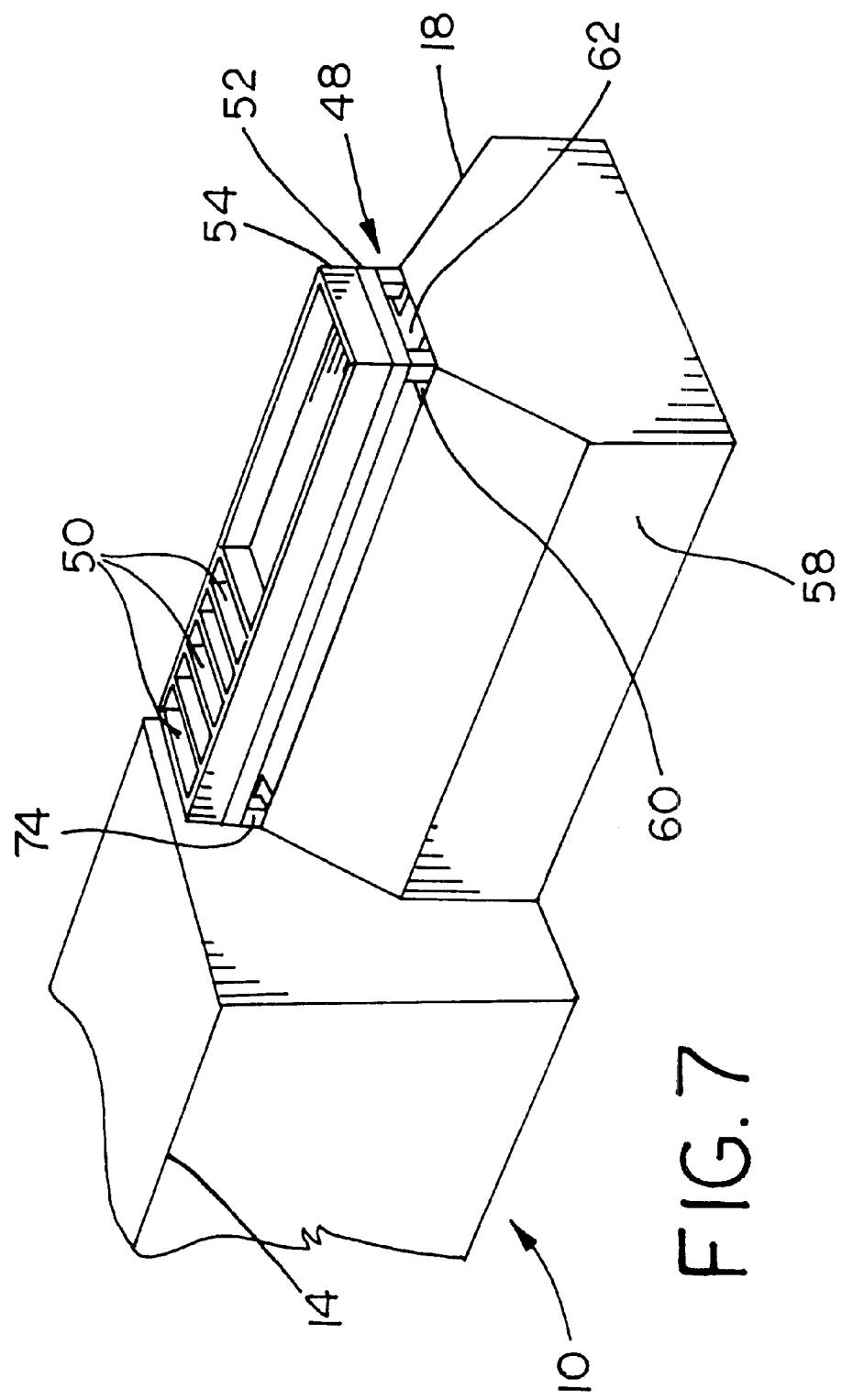
FIG. 7 is a perspective of another embodiment of the storage system mounted directly above a feeder carriage of a surface mount placement machine.

In another embodiment illustrated in FIG. 7, a support structure 48 including a plurality of vertical support members 74 and a plurality of attachment members 60 are adapted to mount directly to an upper surface 62 of the feeder carriage 18. The support structure 48, in turn, supports a shelf 52 directly above the upper surface 62 of the feeder carriage. The shelf 52 and the support structure 48 are located entirely within the footprint of the feeder carriage 18. The shelf 52 is adapted to support a storage tray 54, the storage tray 54 having a plurality of slots 50 intended to vertically store surface mount component reels 26. Installation of the shelf 52 of FIG. 7 on a chipshooter 10 may require modifications to the feeder carriage 18 to insure structural stability of the combined feeder carriage 18 and storage system unit.

Figure 8:
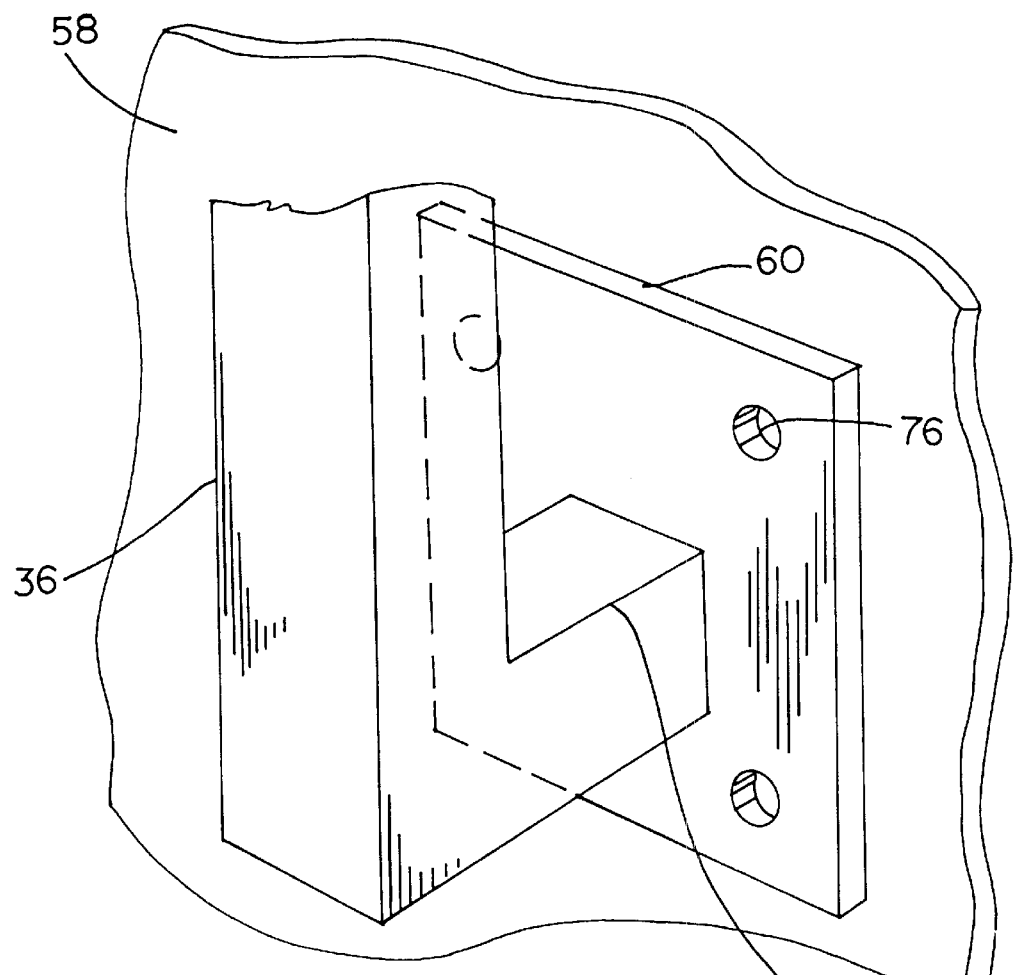
FIG. 8 is a perspective view of one embodiment of an attachment member used to affix a storage system directly to a feeder carriage.

In another embodiment illustrated in FIG. 8, the vertical support members 36 are adapted to cooperate with a horizontal support member 56. The horizontal support member 56 allows the storage system 12 to be mounted directly to a vertical side 58 of the feeder carriage 18, illustrated for clarity in FIG. 7, using attachment plates 60. The attachment plates 60 include a plurality of holes 76 for mounting to the vertical sides 58 of the feeder carriage 18. In this embodiment, and the embodiment illustrated in FIG. 7, the surface mount placement machine can be relocated without having to remove the attachment members 40 from the floor 38 and remount the storage system 12 at the desired location, which reduces the amount of time and effort needed to relocate a surface mount placement machine.

As illustrated in FIG. 1, each of the plurality of storage slots in the storage tray 46 may have a unique identifier 78, each unique identifier 78 corresponding to a single position 22 on the feeder base 20. This identification system allows the operator to double-check and insure that the proper component reel 26 is placed in the proper position 22.

While the storage system 12 has been described herein with references relating directly to turret style machines, these examples are intended to be illustrative only and not to be limiting of the invention. It will be apparent to those of ordinary skill in the art that the storage system 12 may be adapted to utilized the space directly above other types of surface mount placement machines such as the aforementioned gantry style machines without departing from the spirit and scope of the invention.

What is claimed is:

1. A storage system for use with a surface mount placement machine to store components to be used by the surface mount placement machine, comprising:
    a storage tray support member adapted to be cantilevered above the surface mount placement machine, the storage tray support member having a first edge;
    a vertical support member adapted to be placed adjacent to the surface mount placement machine and affixed to the first edge of the storage tray support member;
    an attachment member affixed to the vertical support member; and
    a storage tray disposed on said storage tray support member;
    wherein when the vertical support member is placed adjacent to the surface mount placement machine and when the storage tray is disposed on the storage tray support member a portion of the storage tray extends above floorspace defined by the footprint of the surface mount placement machine.

2. The storage system of claim 1, wherein the storage tray support member includes a plurality of support bars.

3. The storage tray support member of claim 2, wherein the storage tray support member includes a permanent shelf supported by the support bars.

4. The storage system of claim 1, wherein the attachment member is adapted to be secured within an hole in a support floor.

5. The storage system of claim 1, wherein the attachment member is adapted to be secured to a feeder carriage or a feeder bank of the surface mount placement machine.

6. The storage system of claim 1, wherein the storage tray comprises a plurality of slots, the slots adapted to accept surface mount component reels.

7. The storage system of claim 6, wherein each of the plurality of slots tray is elongated to accept multiple surface mount component reels.

8. The storage system of claim 1, wherein the storage tray support member is inclined relative to a feeder bank disposed within the surface mount placement machine, such that component reels are gravity fed to one edge of the support tray, when the storage tray support member is disposed above the surface mount placement machine.

9. The storage system of claim 1, wherein the storage tray is removably disposed on the storage tray support member.

10. The storage system of claim 1, wherein the storage tray has a plurality of unique identifiers, each identifier corresponding to a component reel location defined on a feeder bank disposed within the surface mount placement machine.

11. An apparatus, comprising:
    a surface mount component placer having a component input base; and
    a storage rack disposed directly above the component input base, wherein the storage rack is disposed within the footprint of the surface mount component placer.

12. The apparatus of claim 11, wherein the storage rack further includes a plurality of slots defined within the storage rack.

13. The apparatus of claim 12, wherein each of the plurality of slots is adapted to store a surface mount component reel.

14. The apparatus of claim 12, wherein each of the plurality of slots is elongated to store multiple surface mount component reels.

15. The apparatus of claim 11, further including a support structure, disposed above the surface mount placement machine which accepts the storage rack.

16. The apparatus of claim 15, further including a plurality of vertical support members, said vertical support members fixedly attached to the surface mount placement machine.

17. The apparatus of claim 11, wherein the storage rack is supported by a structure that is adapted to be braced by a cavity in a support floor.

18. The apparatus of claim 11, wherein the storage rack further includes a plurality of identification labels each corresponding to a position within a feeder carriage of the surface mount placement machine.

19. A method for supplying surface mount component reels to a surface mount placement machine comprising the steps of:
    storing the component reels in a tray directly above the surface mount placement machine;
    removing the component reels from the tray and mounting the component reels within the surface mount placement machine.

20. The method of claim 19, further including the steps of placing a unique identifier corresponding to a position within the surface mount placement machine adapted to accept a component reel.

21. The method of claim 19, wherein the step of storing the component reels in a tray includes the step of inclining the tray so that the component reels are gravity fed to an edge of the tray for easy removal.

22. The method of claim 19, wherein the step of storing the component reels in a tray includes the step of uniquely marking the component reels prior to removing the component reels from the tray.

23. The method of claim 19, wherein the step of storing the component reels in a tray further includes the steps of:
    organizing the component reels within the tray in the same sequence they are to be used when secured within the surface mount placement machine;
    transporting multiple trays to a position near the surface mount placement machine; and
    positioning the trays directly above the surface mount placement machine using a mechanical lift.

* * * * *